United States Patent
Xu et al.

(10) Patent No.: US 10,872,774 B2
(45) Date of Patent: Dec. 22, 2020

(54) PLASMA PROCESSING APPARATUS AND PLASMA PROCESSING METHOD

(71) Applicant: HITACHI HIGH-TECH CORPORATION, Tokyo (JP)

(72) Inventors: Hao Xu, Tokyo (JP); Hiroshige Uchida, Tokyo (JP); Shigeru Nakamoto, Tokyo (JP); Kousuke Fukuchi, Tokyo (JP); Satomi Inoue, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/286,303

(22) Filed: Feb. 26, 2019

(65) Prior Publication Data
US 2020/0035445 A1    Jan. 30, 2020

(30) Foreign Application Priority Data
Jul. 24, 2018   (JP) ................................ 2018-138374

(51) Int. Cl.
*H01L 21/3065* (2006.01)
*H01J 37/22* (2006.01)
(Continued)

(52) U.S. Cl.
CPC ........ *H01L 21/3065* (2013.01); *H01J 37/226* (2013.01); *H01J 37/32082* (2013.01);
(Continued)

(58) Field of Classification Search
CPC ........... H01J 37/32009; H01J 37/32082; H01J 37/32128; H01J 37/32137; H01J 37/32174; H01L 21/3065; H01L 21/02315; H01L 21/0234; H01L 21/02348; H01L 21/32136; H01L 21/76826; H01L 21/76862;
(Continued)

(56) References Cited

U.S. PATENT DOCUMENTS

| | | | | | |
|---|---|---|---|---|---|
| 5,138,520 | A | * | 8/1992 | McMillan | ........... C23C 16/4412 361/311 |
| 5,963,840 | A | * | 10/1999 | Xia | ........................ C23C 16/401 438/783 |
| 5,994,209 | A | * | 11/1999 | Yieh | ..................... C23C 16/401 257/E21.149 |
| 2004/0263412 | A1 | * | 12/2004 | Pribyl | ............... H01J 37/32082 343/866 |

(Continued)

FOREIGN PATENT DOCUMENTS

| JP | H06349776 A | 12/1994 |
|---|---|---|
| KR | 20020064028 A | 8/2002 |

OTHER PUBLICATIONS

Office Action dated Dec. 9, 2019 in counterpart Korean Application No. 10-2018-0160647.

*Primary Examiner* — Eduardo A Rodela
(74) *Attorney, Agent, or Firm* — Miles & Stockbridge, P.C.

(57) ABSTRACT

A plasma processing apparatus includes: a processing chamber in which a sample is subjected to plasma treatment; a radio frequency power supply configured to supply radio frequency power that generates plasma; a sample stage on which the sample is placed; and an ultraviolet light source configured to apply an ultraviolet ray. The apparatus further includes a controller configured to control the ultraviolet light source such that before the radio frequency power is supplied into the processing chamber, a pulse-modulated ultraviolet ray is applied into the processing chamber.

6 Claims, 5 Drawing Sheets

(51) Int. Cl.
*H01J 37/32* (2006.01)
*H01L 21/02* (2006.01)
*H01L 21/768* (2006.01)
*H01L 21/3213* (2006.01)
*H01L 21/67* (2006.01)

(52) U.S. Cl.
CPC .... *H01J 37/32715* (2013.01); *H01L 21/0234* (2013.01); *H01L 21/02315* (2013.01); *H01L 21/02348* (2013.01); *H01L 21/32136* (2013.01); *H01L 21/76826* (2013.01); *H01L 21/76862* (2013.01); H01J 2237/3343 (2013.01); H01L 21/67069 (2013.01)

(58) Field of Classification Search
CPC ..... H01L 2224/7501; H01L 2224/7601; H01L 2224/7701; H01L 2224/7801; H01L 2224/7901; H01L 2224/80013
See application file for complete search history.

(56) References Cited

U.S. PATENT DOCUMENTS

| | | | |
|---|---|---|---|
| 2005/0087296 A1* | 4/2005 | Goto | C23C 16/482 156/345.24 |
| 2009/0000942 A1* | 1/2009 | Bai | H05H 1/46 204/164 |
| 2014/0094038 A1* | 4/2014 | Haverkamp | H01L 21/0231 438/786 |
| 2014/0116335 A1* | 5/2014 | Tsuji | H01J 37/32862 118/620 |
| 2014/0262755 A1* | 9/2014 | Deshmukh | H01J 37/32431 204/192.35 |
| 2015/0099369 A1* | 4/2015 | Deshmukh | H01L 21/32135 438/720 |
| 2018/0025928 A1* | 1/2018 | Chito | H01J 37/32009 156/345.28 |

\* cited by examiner

PLASMA PROCESSING APPARATUS AND PLASMA PROCESSING METHOD

CROSS-REFERENCE TO RELATED APPLICATIONS

The present application claims priority to Japanese Patent Application No. 2018-138374, filed Jul. 24, 2018. The contents of this application are incorporated herein by reference in their entirety.

BACKGROUND

The present invention relates to a plasma processing apparatus and a plasma processing method.

Nowadays, design rules for fabrication processes of semiconductor devices, for example, are increasingly strict. It is desired to surely provide products with higher dimensional accuracy. For example, in etching conducted in low temperature gas plasma, a decrease in plasma density is requested in order to increase etching uniformity. In order to decease plasma density, there are methods of lowering gas pressure or microwave electric power, for example. Any method has the possibility of making plasma ignition difficult.

Japanese Unexamined Patent Application Publication No. Hei6 (1994)-349776 discloses a semiconductor fabrication apparatus that simultaneously supplies ultraviolet rays and microwaves to a processing chamber. In this semiconductor fabrication apparatus, supplied ultraviolet rays act so as to excite atoms or molecules in plasma and increase the energy of the atoms or molecules, and microwaves function to maintain the plasma. Therefore, the apparatus enables the improvement of plasma ignitability as well as the improvement of processing rate.

SUMMARY

However, in such a previously existing technique, continuous application of ultraviolet rays to wafers might affect processing dimensions due to an increase in the temperature of wafers.

The present invention is made in view of the problems of the previously existing technique. An object is to provide a plasma processing apparatus and a plasma processing method that can improve plasma ignitability with no change in desired processing conditions and can reduce the influence on the dimensions of a processed workpiece.

In order to solve the problems, one of representative plasma processing apparatuses according to an aspect of the present invention is achieved by a plasma processing apparatus including a processing chamber in which a sample is subjected to plasma treatment; a radio frequency power supply configured to supply radio frequency power that generates plasma; a sample stage on which the sample is placed; and an ultraviolet light source configured to apply an ultraviolet ray. The apparatus further includes a controller configured to control the ultraviolet light source such that before the radio frequency power is supplied into the processing chamber, a pulse-modulated ultraviolet ray is applied into the processing chamber.

One of representative plasma processing apparatuses according to an aspect of the present invention is achieved by a plasma processing apparatus including: a processing chamber in which a sample is subjected to plasma treatment; a radio frequency power supply configured to supply radio frequency power that generates plasma; a sample stage on which the sample is placed; and an ultraviolet light source configured to apply an ultraviolet ray. The apparatus further includes a controller configured to control the radio frequency power supply and the ultraviolet light source such that the radio frequency power is supplied into the processing chamber and a pulse-modulated ultraviolet ray is applied into the processing chamber.

One of representative plasma processing methods according to an aspect of the present invention is achieved by a plasma processing method of processing a sample in a processing chamber using plasma generated by radio frequency power. In the apparatus, before the radio frequency power is supplied into the processing chamber, a pulse-modulated ultraviolet ray is applied into the processing chamber.

According to the present invention, a plasma processing apparatus and a plasma processing method that can improve plasma ignitability with no change in desired processing conditions and can reduce the influence on the dimensions of a processed workpiece can be provided.

Objects, configurations, and effects other than ones described above will be apparent from the description of embodiments below.

DETAILED DESCRIPTION

Figure 1:
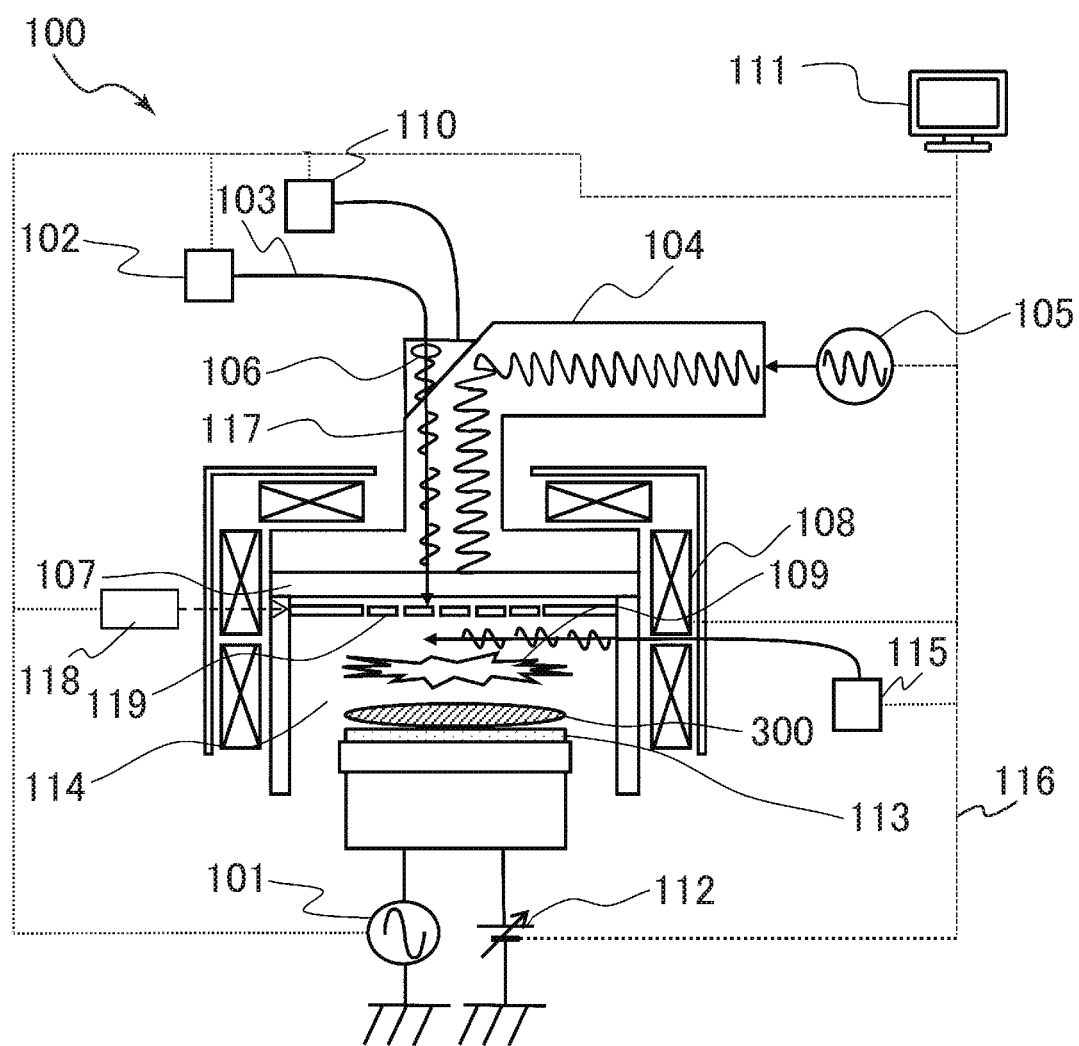
FIG. 1 is a schematic block diagram of a microwave electron cyclotron resonance (ECR) plasma processing apparatus.

A plasma processing apparatus that is an embodiment of the present invention will be described with reference to the drawings. FIG. 1 is a schematic cross-sectional view of a microwave electron cyclotron resonance (ECR) plasma processing apparatus using microwaves and magnetic fields for a plasma generating unit. Specifically, in the case in which process conditions, such as a low gas pressure, low microwave power, and a low duty ratio, are used in the plasma processing apparatus, plasma ignition is not appropriately performed in the start of processes. This is a major technical problem. According to the embodiment, plasma ignitability can be improved even under such conditions.

A microwave ECR plasma processing apparatus 100 includes a processing chamber 114 that is vacuum evacuatable, a sample stage 113 on which a wafer 300 that is a workpiece (also referred to as a sample), a microwave and ultraviolet ray supply port 117 provided above the sample stage 113 from which microwaves and ultraviolet rays are supplied, a waveguide 104 provided above the supply port 117, a magnetron 105 that generates microwaves with the supply of radio frequency power from a built-in first radio frequency power supply, a pulsed ultraviolet light source 102 provided above a waveguide inspection window, a solenoid valve coil 108 provided around the processing chamber 114, an electrostatic chuck power supply 112 connected to the sample stage 113, a radio frequency power supply (a second radio frequency power supply) 101, a process gas supply source 118, and a controller (processor) 111.

Examples of the pulsed ultraviolet light source that can be used include a lamp that can emit light having a wavelength ranging from 185 to 2,000 nm at an output of five watts. With the use of light in the ultraviolet region (185 to 450 nm) in emitted light, processes, described later, can be performed.

In the following, plasma treatment processes using the microwave ECR plasma processing apparatus 100 will be described. First, the wafer 300 is loaded into the processing chamber 114, and then the wafer 300 is electrostatically chucked to the sample stage 113 by the electrostatic chuck power supply 112. Subsequently, a processing gas is supplied from the process gas supply source 118 into the processing chamber 114 through a shower plate 119 via a gas inlet port (not shown), and the pressure of the gas is adjusted to a predetermined pressure using a vacuum pump (not shown).

Subsequently, a microwave having a frequency of 2.45 GHz is oscillated from the magnetron 105, and is propagated in the processing chamber 114 through the waveguide 104. With the action of the microwave and the magnetic field generated by the solenoid valve coil 108, the processing gas is excited, and hence plasma 109 is generated in the space above the wafer 300. With the plasma 109, the wafer 300 placed on the sample stage 113 is etched.

The microwave ECR plasma processing apparatus includes a system that controls the start timing of the devices. Specifically, the devices, such as the radio frequency power supply 101, the pulsed ultraviolet light source 102, the magnetron 105, the solenoid valve coil 108, the electrostatic chuck power supply 112, and the photodetector 110, are connected to the controller 111 via a local area network (LAN) cable 116. The controller 111 forms sequences to individually control these devices. Specifically, the controller 111 can pulse-modulate the pulsed ultraviolet light source 102. Here, the controller 111 can adjust pulse intervals.

When a frequency in circular motion around the magnetic field generated by the solenoid valve coil 108 is matched with a frequency of an electromagnetic wave externally charged, electrons outside gas molecules begin rotational motion at high speed due to resonance (ECR). When the kinetic energy of the electrons is ionization energy or more, atoms and electrons on the outermost electron shell of the molecule go out, and collide against neighboring atoms or molecules. The number of electrons is doubled including colliding electrons and electrons going out of molecules and atoms. As a result, the number of electrons is increased like an avalanche phenoment. After the number of electrons exceeds a certain threshold, plasma is formed. However, when the process conditions are a low gas pressure and low microwave power, plasma ignition is difficult in the case in which the distance between atoms or molecules is long, or in the case in which the ionized electrons do not have energy enough to go out toward neighboring atoms or molecules.

Figure 2:
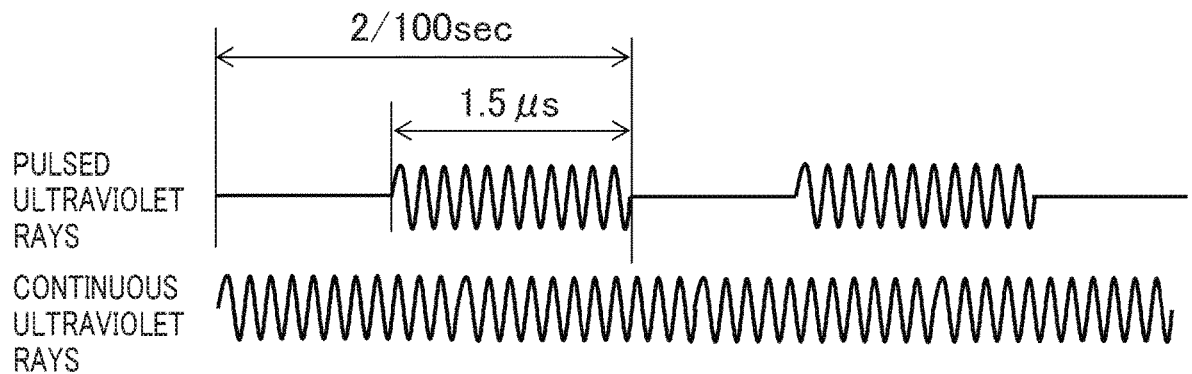
FIG. 2 is a diagram of comparison of duration in pulsed ultraviolet rays with continuous ultraviolet rays where time is expressed on the horizontal axis.

In the embodiment, the microwave ECR plasma processing apparatus 100 is provided with the pulsed ultraviolet light source 102. As shown in FIG. 2, from the pulsed ultraviolet light source 102, pulsed ultraviolet rays are generated at $2/100$ second intervals (pulse-like ultraviolet rays are applied). One pulse (referred to as a flash) of ultraviolet rays continues for 1.5 ρs, as one example, and energy of 100 mJ is emitted in one pulse. Note that the pulse period of ultraviolet rays in the waveform of pulsed ultraviolet rays is different from the irradiation time of ultraviolet rays in scales. The irradiation time of ultraviolet rays is about 6,667 times the pulse period of ultraviolet rays. In the specifications, when the interval of pulsed ultraviolet rays is at least $1/155$ second or more, the temperature of the wafer is not substantially increased. To achieve this, the interval of pulsed ultraviolet rays only has to be at least $1/150$ second or more.

Upon generating pulsed ultraviolet rays by the pulsed ultraviolet light source 102, the generated pulsed ultraviolet rays enter the processing chamber 114 through a silica optical fiber (e.g. diameter: 0.8 mm) 103 and a collimating lens (e.g. diameter: 3 mm, diffusibility tan (a): 0.08, where a=fiber diameter/focal point) 106 in parallel with the microwave incident direction toward the surface of the unprocessed wafer. Thus, electrons on the outer shell of the process gas molecules or atoms absorb photons from the pulsed ultraviolet rays, and hence the electrons are excited.

When the pulsed ultraviolet rays that have passed through the processing gas enter the surface of the wafer, a photoelectric effect occurs on the surface of the wafer, and hence free electrons are produced. Thus, microwaves are charged, excited electrons or free electrons are used in the processing chamber 114 before ignition, and hence the ignitability of plasma can be improved.

As described above, the reason why ultraviolet rays are applied to the processing gas before microwaves and magnetic fields are introduced is that the level of electrons on the outer side of process gas molecules or atoms (for excitation) is increases. Typically, the excited state of electrons is unstable, and electrons can stay in the excited state only for $10^{-8}$ seconds. When there is a spark for ignition, plasma is instantaneously generated by the avalanche phenoment. Thus, the application of pulsed ultraviolet rays having a high instantaneous optical output can more instantaneously excite a large amount of a gas than the application of continuous ultraviolet rays, and this is suited to achieving the improvement of plasma ignition.

A pulsed ultraviolet light source that stores electric charges on a capacitor to emit light can be used. Thus, the warm-up of the light source in order to generate pulsed ultraviolet rays is eliminated, the operation timing of processes is easily set, and hence the configuration is suited to applications. Note that in the case in which ultraviolet rays are continuously emitted at the same 100 mJ power, a large-sized power supply of about 70 KW is necessary. This leads to an increase in facility costs of plasma apparatuses, resulting in no power saving as well. Also from these viewpoints, use of pulsed ultraviolet rays is desirable.

Figure 3:
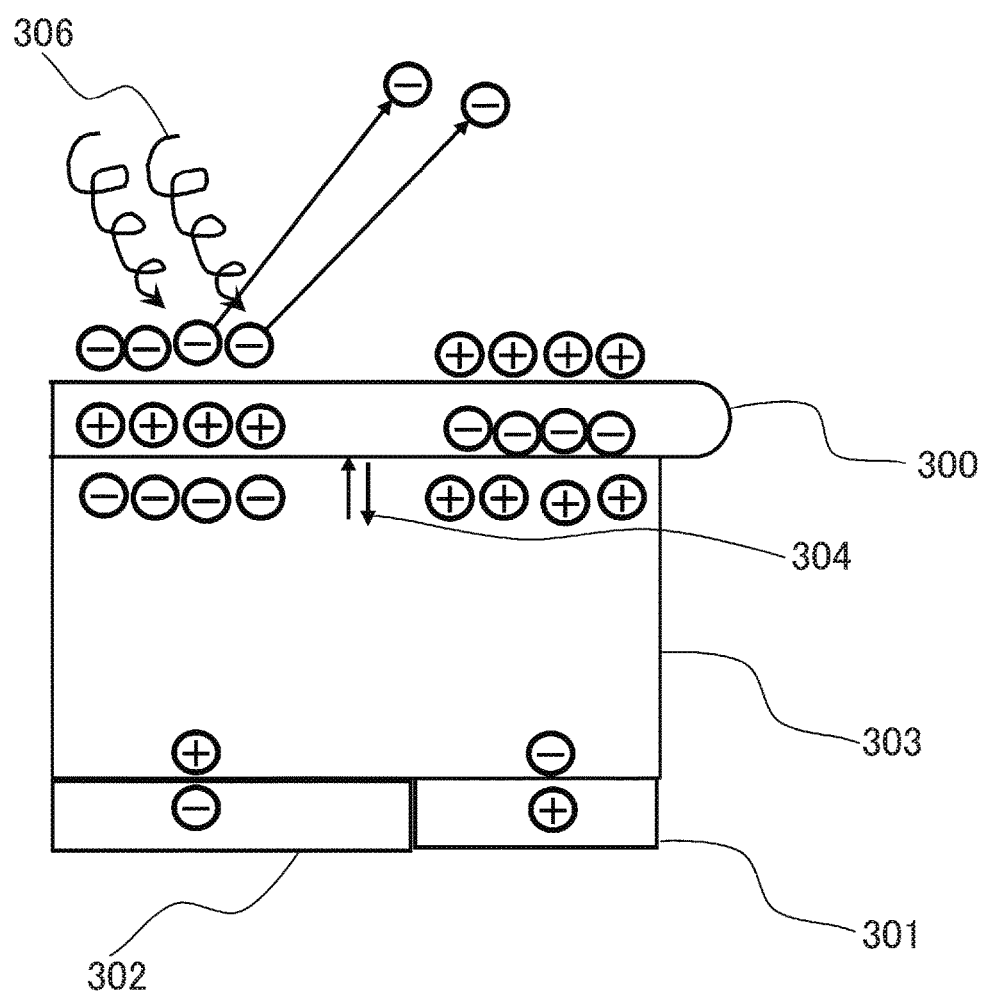
FIG. 3 is a schematic diagram of a dielectric isolation state in which a wafer is placed on a sample stage and an electrostatically chucking voltage is applied.

FIG. 3 is an enlarged diagram of an electrode provided on the sample stage. This electrode has a disc-like inner electrode base material 301, an annular outer electrode base material 302 surrounding the base material 301, and a thermal spraying film 303. Upon the application of voltages having different polarities (e.g. +1,500V and −1,500V) to two electrode base materials 301 and 302 that are electrically isolated by the electrostatic chuck power supply 112 (FIG. 1), positive and negative potentials are produced in regions corresponding to the electrode base materials 301 and 302 on the surface of the thermal spraying film 303 and the back surface of the wafer 300 by induced electricity. The wafer 300 is chucked to the electrode surface by Coulomb attraction 304 produced by these potentials. Note that for the electrode provided on the sample stage, only a one-pole electrode member having a negative potential may be provided.

After the wafer 300 is placed on the sample stage 113 (FIG. 1), the wafer 300 is electrostatically chucked to the sample stage 113 by the electrostatic chuck power supply 112. More specifically, as shown in FIG. 3, in the case in which a negative voltage is applied to the thermal spraying film 303, the center of the surface of the wafer 300 has a negative potential by induced electricity. That is, in this state, electrons are abundantly present on the center of the surface of the wafer 300. Here, upon the application of pulsed ultraviolet rays 306 to the center of the surface of the wafer 300 on which electrons are abundantly present, electrons go out of the center of the surface of the wafer 300 by the photoelectric effect, and the going electrons are accelerated toward the processing gas by the negative potential on the surface of the wafer 300. The electrons are accelerated by microwaves and magnetic fields near the ECR surface, and are a spark for plasma ignition.

Figure 4:
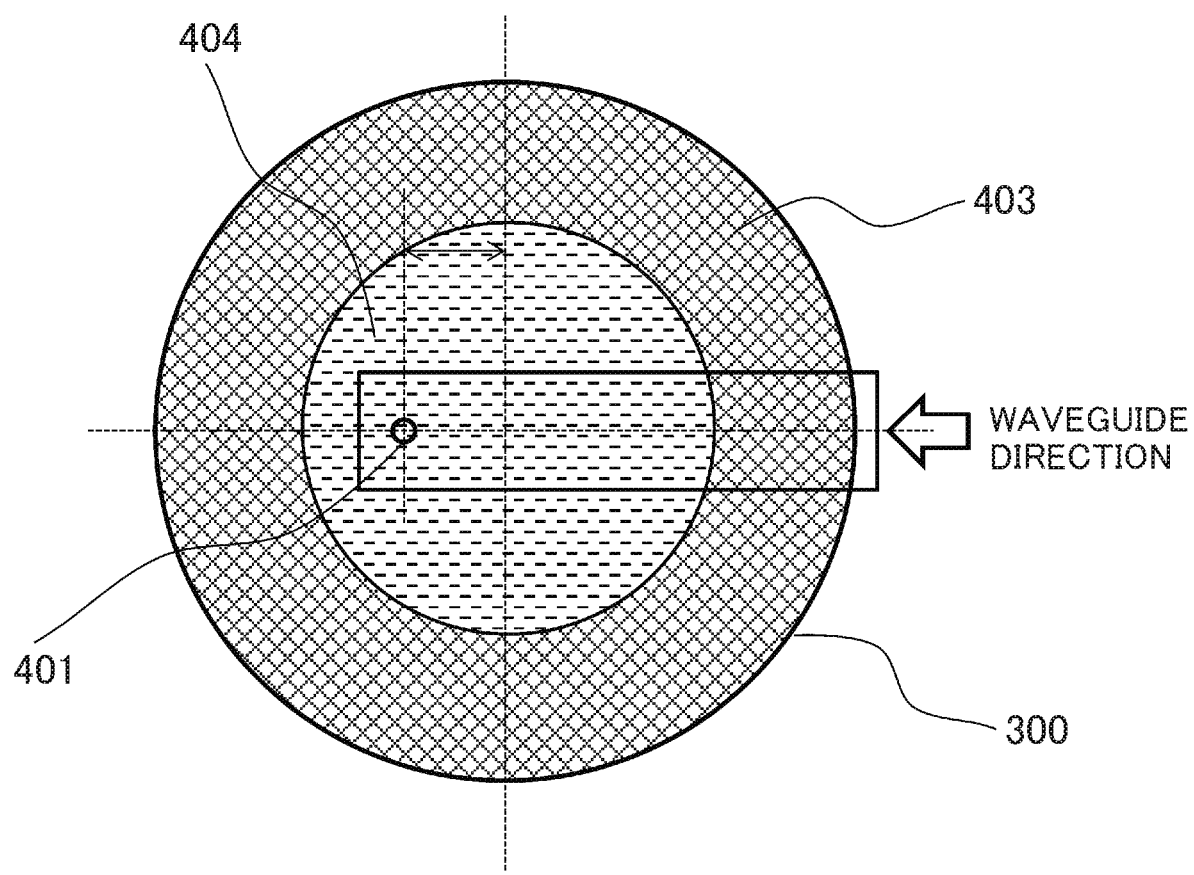
FIG. 4 is a top view of a wafer illustrating a position at which ultraviolet rays are applied from a pulsed ultraviolet light source and the charge distribution state of a wafer.

Upon the application of a negative voltage to the inner electrode base material 301, a center region 404 (FIG. 4), corresponding to the inner electrode base material 301, the surface of the electrostatically chucked wafer 300 has negative electric charges, and an outer region 403 (FIG. 4) on the surface of the wafer 300 corresponding to the outer electrode base material 302 has positive electric charges. Thus, preferably, an application position 401 of pulsed ultraviolet rays is provided above the center region 404 having negative electric charges on the electrostatically chucked wafer 300, and pulsed ultraviolet rays are applied to the region (the negatively charged region) having the negative electric charges described above. The pulsed ultraviolet power supply is preferably operated before the wafer 300 that has to be processed is electrostatically chucked.

Here, in the microwave ECR plasma processing apparatus, under the conditions in which the distance from the collimating lens to the wafer is about 785 mm, when pulsed ultraviolet rays are applied to the surface of the wafer 300 through the optical fiber 103 and the collimating lens 106 as described above, the application range of the surface of the wafer is a circular region in a diameter of six centimeters. When optical losses during propagation are ignored, the intensity of light received on the surface of the wafer for an irradiation time of 1.5 ρs is 161 mJ/s/cm$^2$. By lamp heating, a quantity of heat imparted is about 1/10 of the light intensity (16.1 mJ/s/cm$^2$), and this is smaller than a quantity of heat (500 mJ/s/cm$^2$) from plasma during processing. Thus, the temperature of the surface of the wafer is almost the same. On the other hand, when light is continuously applied at 100 mJ power for one second, the intensity of light reaching the surface of the wafer is 41,551 mJ/s/cm$^2$, and this might increase the temperature of the surface of the wafer. Thus, in order to impart sufficient energy for ignition with no increase in the temperature of the surface of the wafer, pulsed ultraviolet rays are desirably used.

In order to avoid losses of pulsed ultraviolet rays and microwaves in the midway point of propagation, the optical fiber 103 is desirably used for propagating ultraviolet rays. Moreover, silica products are preferably used for a top plate 107 and the shower plate 119 provided above the processing chamber 114.

In order to check the effect of improvement of plasma ignition in the application of pulse-modulated ultraviolet rays to the processing gas and the negatively charged region on the surface of the wafer, ignition improvement confirmation experiments are performed by at least two recipes using the microwave ECR plasma processing apparatus 100 described above. For the experiments to check the effect of improvement of plasma ignition, three types of process patterns (see FIG. 5), and two types of process conditions (see Tables 1 and 2) are prepared.

Figure 5A:
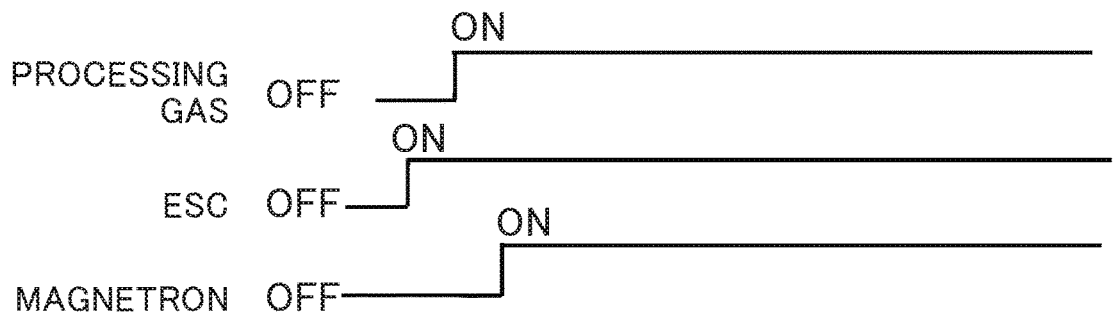
FIG. 5A is a diagram of the start timing sequence of the plasma processing apparatus where on/off timing of components is on the vertical axis and time is on the horizontal axis.
Figure 5B:
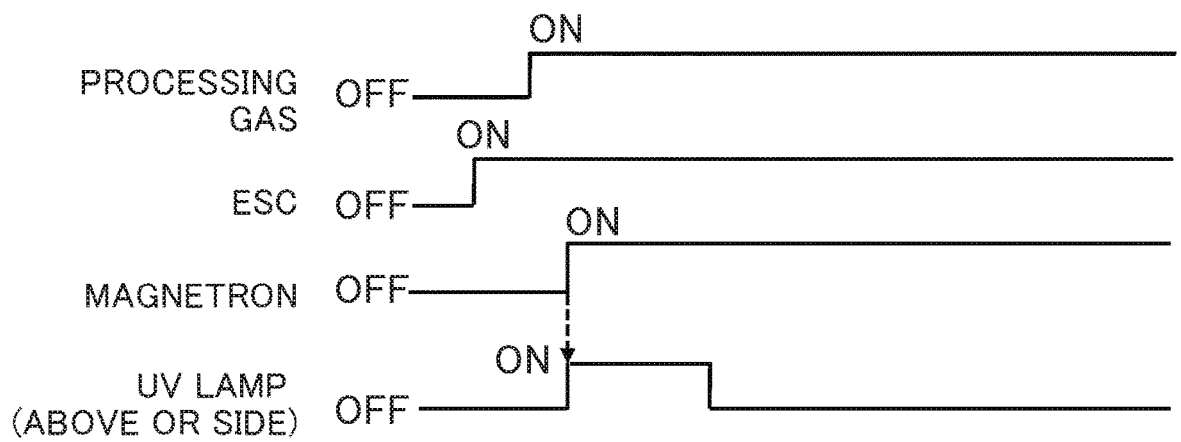
FIG. 5B is a diagram of the start timing sequence of the plasma processing apparatus where on/off timing of components is on the vertical axis and time is on the horizontal axis.
Figure 5C:
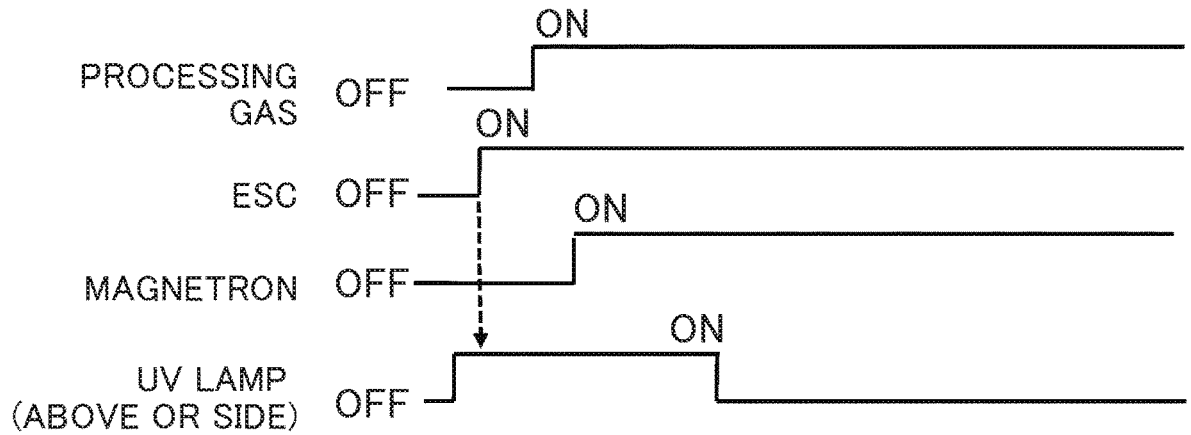
FIG. 5C is a diagram of the start timing sequence of the plasma processing apparatus where on/off timing of components is on the vertical axis and time is on the horizontal axis.

The three process patterns (also simply referred to as patterns) used in the confirmation experiments using the microwave ECR plasma processing apparatus 100 described above will be described. In FIGS. 5A, 5B, and 5C, the term "ESC" means the drive voltage of the electrostatic chuck power supply. In Process pattern 1 shown in FIG. 5A, an unprocessed wafer is loaded into the processing chamber 114, an ESC voltage is first applied to the wafer to chuck the wafer with the wafer placed on the electrode of the sample stage 113, a processing gas is introduced, the pressure in the chamber 114 is adjusted to a predetermined pressure using a vacuum pump (not shown), a predetermined microwave and a predetermined magnetic field are introduced by magnetron drive, and then plasma is ignited. In Process pattern 1, no pulsed ultraviolet rays are applied.

On the other hand, in Process pattern 2 shown in FIG. 5B, an unprocessed wafer is loaded into the processing chamber 114, an ESC voltage is first applied to the wafer to chuck the wafer with the wafer placed on the electrode of the sample stage 113, a processing gas is introduced, the pressure in the chamber 114 is adjusted to a predetermined pressure using a vacuum pump (not shown), a pulsed ultraviolet light source (102 or 115) is further operated, a predetermined microwave and a predetermined magnetic field are subsequently introduced by magnetron drive, and then plasma is ignited.

In Process pattern 3 shown in FIG. 5C, an unprocessed wafer is loaded into the processing chamber 114, the wafer is placed on the electrode of the sample stage 113, the pulsed ultraviolet light source (102 or 115) is first operated, an ESC voltage is subsequently applied to chuck the wafer, a processing gas is then introduced by the controller 111, the pressure in the chamber 114 is adjusted to a predetermined pressure using a vacuum pump (not shown), a predetermined microwave and a predetermined magnetic field are introduced by magnetron drive, and then plasma is ignited.

Two process conditions for the confirmation experiments using the microwave ECR plasma processing apparatus 100 described above will be described.

Table 1 and Table 2 show two types of process conditions. The parameters of the process conditions are referred to as a recipe. The operation based on the recipes shown in Tables 1 and 2 is performed. In Recipe 1, $Cl_2$ is used as a processing gas, a flow rate is 150 ml/min, and a gas pressure and microwave electric power are respectively set to 0.5 Pa and 1,000 W.

TABLE 1

| Process Conditions | | | |
|---|---|---|---|
| Recipe | Gas flow rate (ml/min) Cl2 | Pressure (Pa) | Microwave (W) |
| 1 | 150 | 0.5 | 1000 |

| Experimental Result | | | | | | | | | | |
|---|---|---|---|---|---|---|---|---|---|---|
| | Number of times | | | | | | | | | Mean |
| | 1 | 2 | 3 | 4 | 5 | 6 | 7 | 8 | 9 | 10 | value(s) |
| 1 | 0.6 | 1.4 | 1.2 | 1.2 | 1.0 | 2.0 | 0.8 | 1.2 | 0.7 | 1.2 | 1.13 |
| 2 | 0.5 | 1.0 | 1.0 | 1.1 | 0.5 | 2.2 | 0.6 | 1.4 | 1.3 | 0.4 | 1.00 |
| 2 | 0.4 | 0.6 | 0.4 | 0.6 | 0.8 | 1.0 | 0.5 | 1.1 | 0.6 | 0.9 | 0.64 |

In Recipe 2, $Cl_2$ and $CH_3F$ are used as processing gases, a flow rate is 40 ml/min in $Cl_2$, a flow rate is 150 ml/min in $CH_3F$, and a gas pressure and microwave electric power are respectively set to 0.2 Pa and 600 W. Recipe 2 has a gas pressure and microwave electric power lower than Recipe 1, and ignition is relatively difficult in Recipe 2.

TABLE 2

| Process Conditions | | | | |
|---|---|---|---|---|
| Recipe | Gas flow rate (ml/min) | | Pressure (Pa) | Microwave (W) |
| | Cl2 | CH3F | | |
| 2 | 40 | 10 | 0.2 | 600 |

| Experimental Result | | | | | | | | | | |
|---|---|---|---|---|---|---|---|---|---|---|
| | Number of times | | | | | | | | | Mean |
| | 1 | 2 | 3 | 4 | 5 | 6 | 7 | 8 | 9 | 10 | value(s) |
| 1 | 0.7 | 1.8 | 1.3 | 5.4 | 8.7 | 1.1 | 10.1 | 4.1 | 3.4 | 10.1 | 4.67 |
| 3 | 0.6 | 0.7 | 0.8 | 0.7 | 0.8 | 0.9 | 0.9 | 1.1 | 0.9 | 1.3 | 0.87 |

Figure 6:
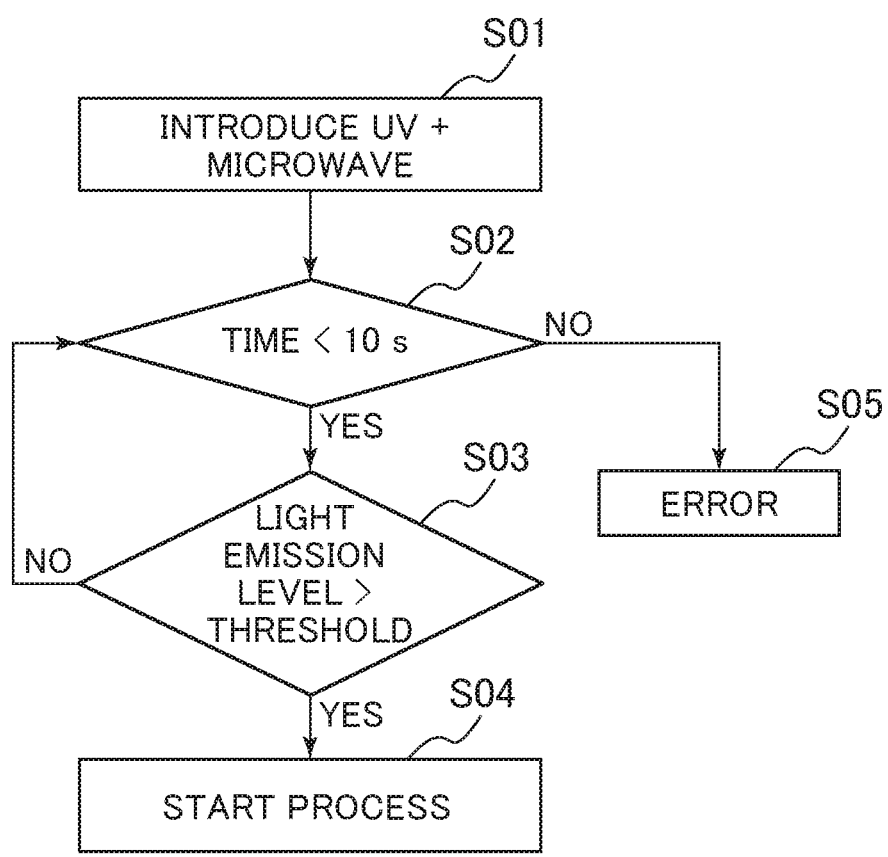
FIG. 6 is a flowchart of a flow of ignition determination and ignition time recording.

FIG. 6 is a flowchart of a process flow of determination and recording of ignition time performed by the controller 111. A photodetector 110 in FIG. 1 monitors the light emission status (the light emission level) in the processing chamber, and sends the data to the controller 111. In Step S01, the introduction of pulsed ultraviolet rays, a predetermined microwave, and a predetermined magnetic field is started as well as the controller 111 starts a counter (not shown). First, in Step S02, when the controller 111 determines that a count time of ten seconds is not passed yet (Yes in Step S02), in Step S03, the controller 111 analyzes light emission data. When the light emission level exceeds a certain threshold (Yes in Step S03), the controller 111 determines that plasma is ignited, and the controller 111 starts processing in Step S04, stops the counter, and stores the count time as plasma ignition time.

On the other hand, when the light emission level is below a certain threshold (No in Step S03), the controller 111 returns the flow to Step S02, and the controller 111 continues counting while introducing pulsed ultraviolet rays, a predetermined microwave, and a predetermined magnetic field. In Step S03, the controller 111 keeps monitoring light emission level.

During monitoring the light emission level, when the controller 111 determines that a count time of ten seconds is passed from the start of the introduction of pulsed ultraviolet rays, a predetermined microwave, and a predetermined magnetic field (No in Step S02), the controller 111 determines that plasma ignition fails, and considers the failure to be an error in Step S05. In this case, the controller 111 sores the plasma ignition time as 10.1 seconds.

[Study on Ignition Improvement and Dependence on the Application Direction]

The following comparative tests are conducted to confirm the effect of ignition improvement:
1. Process pattern 1 in FIG. 5A (with no ultraviolet rays). 2. Process pattern 2 in FIG. 5B (where the pulsed ultraviolet light source 115 on the side of the apparatus is used, and the pulsed ultraviolet rays are entered into the processing chamber 114 from the lateral side). 3. Process pattern 2 in FIG. 5B (the pulsed ultraviolet light source 102 above the apparatus is used, and pulsed ultraviolet rays are entered into the processing chamber 114 from above).

As shown in Table 1, in Process pattern 1, the process of Recipe 1 is performed ten times on a silicon (Si) wafer. The mean value of the ignition time for ten times is 1.13 seconds. Subsequently, in Process pattern 2, the process of Recipe 1 is performed ten times on an Si wafer. The mean value of the ignition time for ten times is 1.00 seconds. Lastly, in Process pattern 2, the process of Recipe 1 is performed ten times on an Si wafer. The mean value of the ignition time for ten times is 0.64 seconds.

From the results above, it is revealed that pulsed ultraviolet ray application more improves plasma ignitability than no pulsed ultraviolet ray application. It is revealed that pulsed ultraviolet ray application from above (application of pulsed ultraviolet rays toward the Si wafer and the processing gas) enables further improvement of ignitability than pulsed ultraviolet ray application from the lateral side.

[Study on Ignition Improvement]

The following comparative tests are conducted to confirm the effect of ignition improvement:
1. Process pattern 1 in FIG. 5A (with no ultraviolet rays). 2. Process pattern 3 in FIG. 5C (where the pulsed ultraviolet light source 102 above the apparatus is used, and pulsed ultraviolet rays are entered into the processing chamber 114 from above).

As shown in Table 2, in Process pattern 1, the process of Recipe 2 is performed ten times on an Si wafer. The mean value of the ignition time for ten times is 4.67 seconds. On the other hand, in Process pattern 3, the process of Recipe 2 is performed ten times on an Si wafer. The mean value of the ignition time for ten times is 0.87 seconds.

From the results above, it is revealed that although the recipes are changed, pulsed ultraviolet ray application more improves plasma ignitability than no pulsed ultraviolet ray application.

From the confirmation experiments above, it is revealed that pulsed ultraviolet ray application to any of the processing gas and the surface of the wafer shows the effect of ignition improvement. Since the best ignition effect is achieved in combination of two effects, the pulsed ultraviolet light source is preferably operated before the wafer is electrostatically chucked. This is because ultraviolet rays are applied before the wafer is electrostatically chucked, and this increases the number of electrons to go out on the wafer.

Specifically, the following process is desirable. In the microwave ECR plasma processing apparatus 100 according to the embodiment, first, the pulsed ultraviolet light source 102 is operated, and the application of pulsed ultraviolet rays is started. Subsequently, the unprocessed wafer 300 is electrostatically chucked on the sample stage 113 by applying a direct current voltage from the electrostatic chuck power supply 112. Subsequently, a processing gas is supplied, and the pressure of the gas is adjusted to a predetermined pressure using the vacuum pump. Subsequently, microwaves generated from the magnetron 105 and magnetic fields generated from the solenoid valve coil 108 are introduced into the processing chamber for plasma ignition. When plasma ignition occurs, plasma is continuously generated after the ignition. With the plasma described above, a predetermined process is performed on the semiconductor wafer.

In the foregoing embodiment, the electron cyclotron resonance (ECR) is described as the plasma generating unit. However, the embodiment is non-limiting. The embodiment is applicable to other plasma discharge methods where a processing gas is excited. For example, the embodiment of the present invention is also applicable to plasma generating methods, such as capacitive coupled plasma (CCP), inductively coupled plasma (ICP), and electro magnetically coupled plasma (EMCP).

Note that the present invention is not limited to the foregoing embodiment, and includes various exemplary modifications. For example, the foregoing embodiment describes the configurations in detail for easy understanding the present invention. The present invention is not necessarily limited to ones having all the described configurations. A part of the configuration of an embodiment can be replaced by the configuration of another embodiment, and the configuration of an embodiment can be additionally provided with the configuration of another the embodiment. On a part of the configurations of the embodiments, another configuration can also be added, removed, or replaced.

What is claimed is:

1. A plasma processing apparatus comprising:
   a processing chamber in which a sample is subjected to plasma processing;
   a radio frequency power supply supplying radio frequency power that generates plasma;
   a sample stage on which the sample is placed;
   an ultraviolet light source applying an ultraviolet ray; and
   a controller configured to control the ultraviolet light source such that before the radio frequency power is supplied into the processing chamber, a pulse-modulated ultraviolet ray is applied into the processing chamber,
   wherein the sample stage includes an electrode to which a direct current voltage is applied, the sample being electrostatically chucked by the direct current voltage, and
   wherein the controller is configured to control the ultraviolet light source each that before the direct current voltage is applied to the electrode, the pulse-modulated ultraviolet ray is applied into the process chamber.

2. The plasma processing apparatus according to claim 1, wherein the ultraviolet light source is disposed such that the pulse-modulated ultraviolet ray is applied to the sample.

3. The plasma processing apparatus according to claim 2, wherein the ultraviolet light source is disposed such that the pulse-modulated ultraviolet ray is applied to a negatively charged region of a sample electrostatically chucked to the sample stage.

4. A plasma processing apparatus comprising:
   a processing chamber in which a sample is subjected to plasma processing;
   a radio frequency power supply supplying radio frequency power that generates plasma;
   a sample stage on which the sample is placed;
   an ultraviolet light source applying an ultraviolet ray; and
   a controller configured to control the radio frequency power supply and the ultraviolet light source such that the radio frequency power is supplied into the processing chamber and a pulse-modulated ultraviolet ray is applied into the processing chamber,
   wherein the sample stage includes an electrode to which a direct current voltage is applied, the sample being electrostatically chucked by the direct current voltage, and
   wherein the controller is configured to control the ultraviolet light source each that before the direct current voltage is applied to the electrode, the pulse-modulated ultraviolet ray is applied into the process chamber.

5. The plasma processing apparatus according to claim 4, wherein the ultraviolet light source is disposed such that the pulse-modulated ultraviolet ray is applied to the sample.

6. A plasma processing method of processing a sample in a processing chamber using plasma generated by radio frequency power, the method comprising:
   before radio frequency power is supplied into the processing chamber, applying a pulse-modulated ultraviolet ray into the processing chamber; and
   after the pulse-modulated ultraviolet ray is applied into the processing chamber, applying a direct current voltage to an electrode of a sample stage to electrostatically chuck said sample using the direct current voltage.

* * * * *